(12) United States Patent
Walker

(10) Patent No.: US 8,329,495 B2
(45) Date of Patent: Dec. 11, 2012

(54) METHOD OF FORMING PHOTOVOLTAIC MODULES

(75) Inventor: Chris Walker, Lenexa, KS (US)

(73) Assignee: Preco, Inc., Lenexa, KS (US)

( * ) Notice: Subject to any disclaimer, the term of this patent is extended or adjusted under 35 U.S.C. 154(b) by 43 days.

(21) Appl. No.: 13/028,533

(22) Filed: Feb. 16, 2011

(65) Prior Publication Data

US 2012/0040488 A1 Feb. 16, 2012

Related U.S. Application Data

(60) Provisional application No. 61/305,366, filed on Feb. 17, 2010.

(51) Int. Cl.
*H01L 21/00* (2006.01)

(52) U.S. Cl. ............... 438/67; 438/68; 438/73; 438/74; 438/83; 257/E27.123; 257/E27.124; 257/E27.125; 257/E25.001; 257/E25.002; 257/E25.011

(58) Field of Classification Search .................. None
See application file for complete search history.

(56) References Cited

U.S. PATENT DOCUMENTS

| 5,733,382 | A * | 3/1998 | Hanoka | 136/251 |
| 7,122,398 | B1 * | 10/2006 | Pichler | 438/66 |
| 7,288,429 | B2 * | 10/2007 | Yaung et al. | 438/74 |
| 2005/0214962 | A1 * | 9/2005 | Daniels et al. | 438/22 |
| 2006/0157103 | A1 * | 7/2006 | Sheats et al. | 136/244 |

* cited by examiner

*Primary Examiner* — Julio J Maldonado
*Assistant Examiner* — Yasser Abdelaziez
(74) *Attorney, Agent, or Firm* — Hovey Williams LLP

(57) ABSTRACT

A method of forming a PV module includes forming conductors on a top surface of a PV coated substrate; forming insulators on the top surface of the PV coated substrate; and cutting the PV coated substrate to form a plurality of individual PV cells. The PV coated substrate is cut so that each of the PV cells has some of the conductors and an insulator on its top surface. Multiple PV cells are then joined to form a PV module by attaching an edge of a first one of the PV cells under an edge of a second one of the PV cells so that at least a portion of the conductors on the first PV cell electrically contacts a bottom surface of the second PV cell.

17 Claims, 5 Drawing Sheets

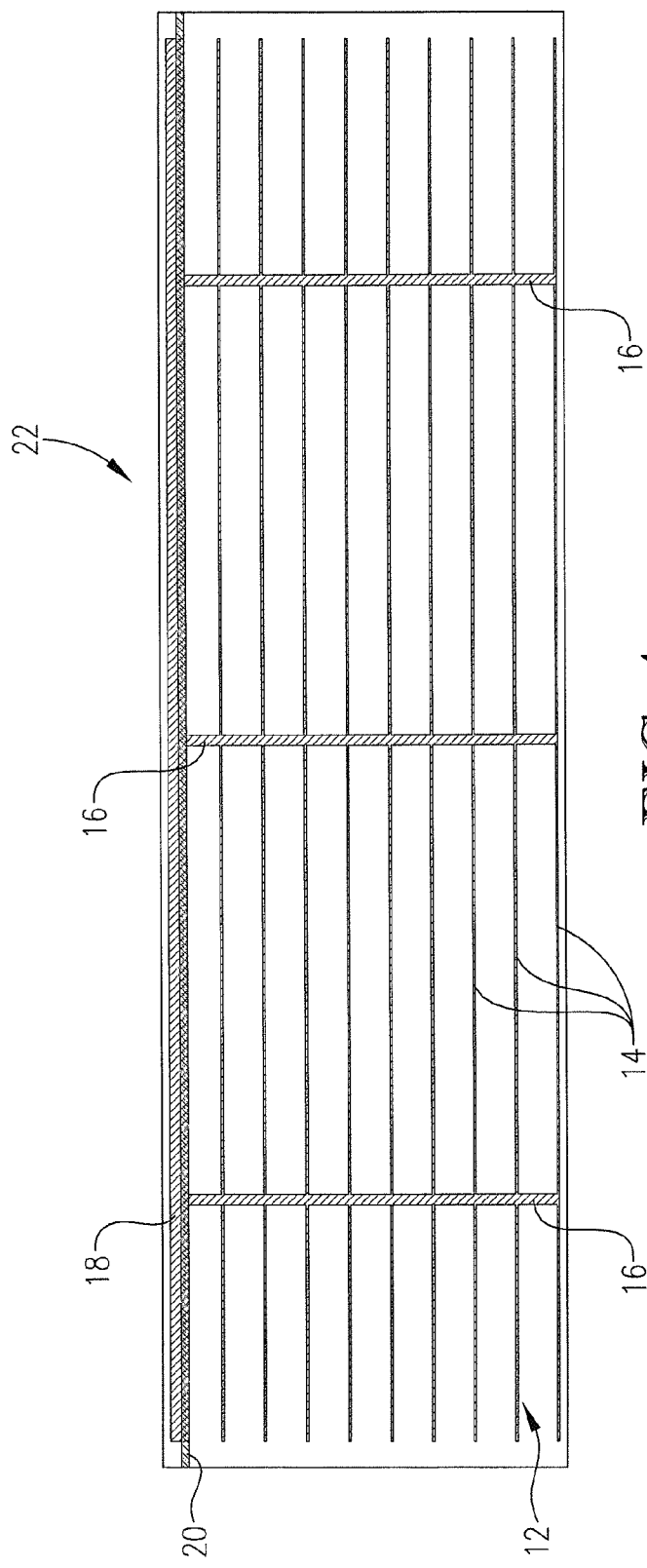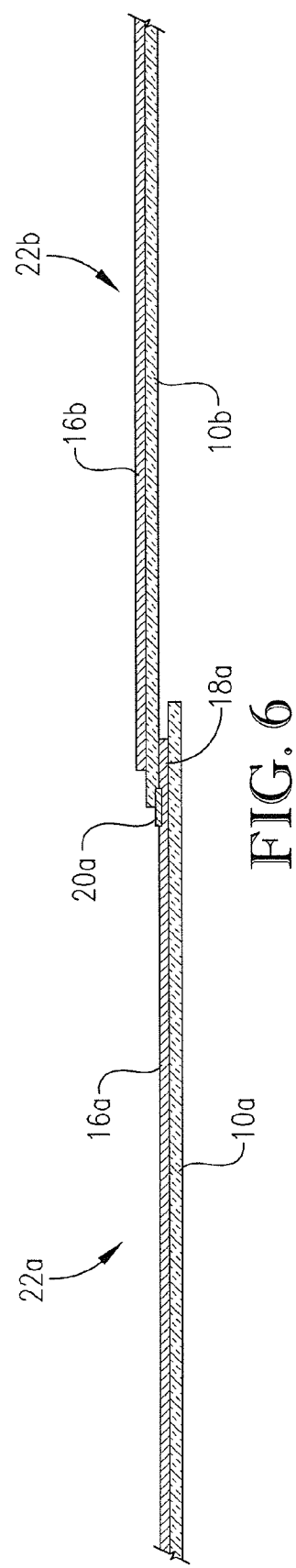

METHOD OF FORMING PHOTOVOLTAIC MODULES

RELATED APPLICATION

This non-provisional application claims the benefit of U.S. Provisional Application Ser. No. 61/305,366, entitled "METHOD OR PROCESS FOR SOLAR CELL SERIES ARRAY ASSEMBLY," filed Feb. 17, 2010. The identified provisional application is incorporated herein by specific reference.

BACKGROUND

Photovoltaic (PV) cells, also commonly referred to as solar cells, convert the energy from sunlight directly into electricity by the photovoltaic effect. Until recently, most PV cells were formed of semiconductor-grade crystalline-silicon wafers, which are expensive to produce. Now, less labor-intensive and easier to manufacture thin-film PV cells, which are made by depositing one or more thin layers of photovoltaic material on a substrate, are becoming more common.

When more electricity is required than a single PV cell can deliver, multiple PV cells can be electrically connected together and packaged to form a PV module or panel. Multiple PV modules may then be arranged to form a PV solar array.

To form a PV module, the individual PV cells must be electrically interconnected. This has been traditionally accomplished by connecting the PV cells with conductive ribbons or wires in an under-and-over stringing and welding of the cells. These connection methods are costly and time-consuming and are part of the reason why PV modules are still too labor-intensive for many applications.

SUMMARY

The present invention solves the above-described problems and provides a distinct advance in the art of PV cells and PV modules. More particularly, the present invention provides an improved method of forming PV modules from individual PV cells.

Embodiments of the invention interconnect individual PV cells to form a PV module by overlapping and bonding the edges of adjacent PV cells rather than connecting the PV cells by wires or other conductors. For example, an embodiment of the invention is a method of forming a PV module comprising forming conductors on a top surface of a PV coated substrate; forming a series of insulators on the top surface of the PV coated substrate; and cutting the PV coated substrate to form a plurality of individual PV cells. The PV coated substrate is cut so that each of the PV cells has some of the conductors and an insulator along an edge of its top surface. The method then comprises attaching an edge of a first one of the PV cells under an edge of a second one of the PV cells so that at least a portion of the conductors on the first PV cell electrically contact a bottom surface of the second PV cell. The first and second PV cells may then be bonded together by applying pressure and heat to the edges of the PV cells.

The method may further include overlapping additional PV cells in the same manner to form a PV module with any desired number of individual PV cells. Once all of the PV cells have been attached, the entire PV module may be further cured and bonded by the application of pressure and/or heat.

This summary is provided to introduce a selection of concepts in a simplified form that are further described in the detailed description below. This summary is not intended to identify key features or essential features of the claimed subject matter, nor is it intended to be used to limit the scope of the claimed subject matter. Other aspects and advantages of the present invention will be apparent from the following detailed description of the embodiments and the accompanying drawing figures.

BRIEF DESCRIPTION OF THE DRAWING FIGURES

Embodiments of the present invention are described in detail below with reference to the attached drawing figures, wherein:

FIG. 4 is an enlarged plan view of a single PV cell.

FIG. 6 is a vertical sectional view taken along line 6-6 of FIG. 5.

Figure 1:
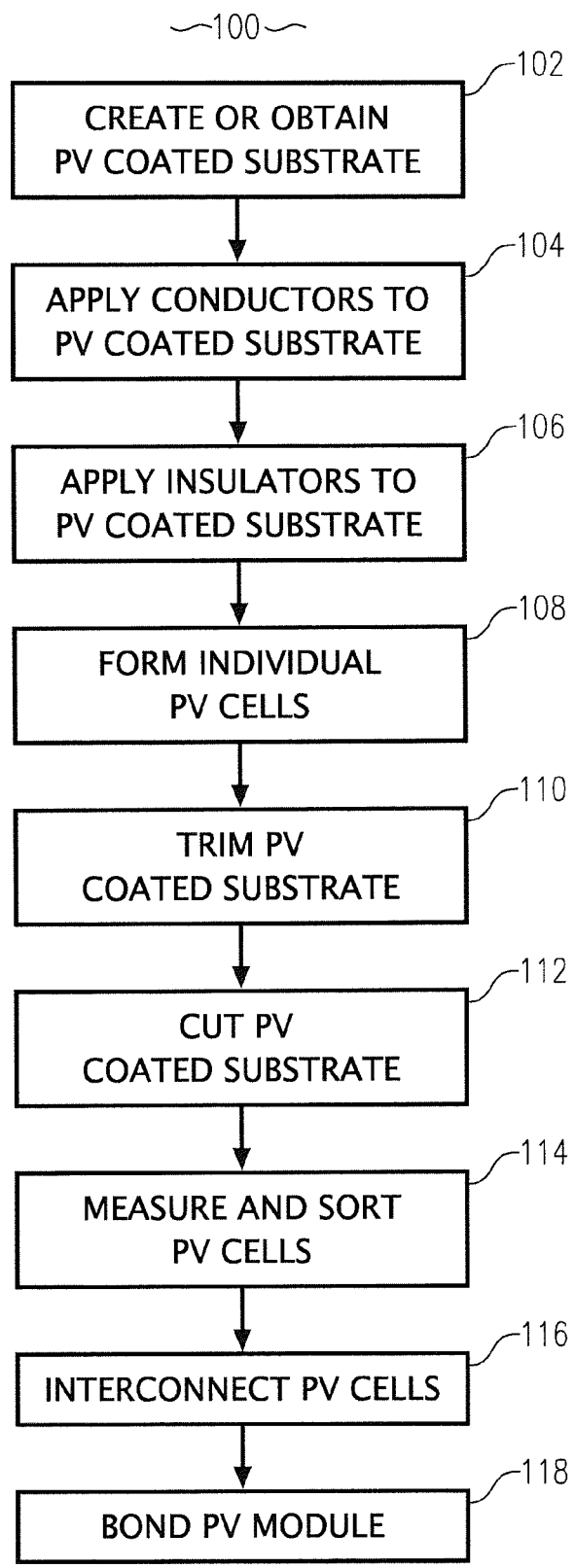
FIG. 1 is a flow diagram depicting a method for forming a plurality of individual PV cells and a PV module in accordance with embodiments of the invention.

The drawing figures do not limit the present invention to the specific embodiments disclosed and described herein. The drawings are not necessarily to scale, emphasis instead being placed upon clearly illustrating the principles of the invention.

DETAILED DESCRIPTION

The following detailed description of embodiments of the invention references the accompanying drawings. The embodiments are intended to describe aspects of the invention in sufficient detail to enable those skilled in the art to practice the invention. Other embodiments can be utilized and changes can be made without departing from the scope of the claims. The following detailed description is, therefore, not to be taken in a limiting sense. The scope of the present invention is defined only by the appended claims, along with the full scope of equivalents to which such claims are entitled.

In this description, references to "one embodiment", "an embodiment", or "embodiments" mean that the feature or features being referred to are included in at least one embodiment of the technology. Separate references to "one embodiment", "an embodiment", or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the present technology can include a variety of combinations and/or integrations of the embodiments described herein.

Turning now to the drawing figures, the flow chart of FIG. 1 shows a method 100 for forming a plurality of individual photovoltaic (PV) cells and a PV module in accordance with embodiments of the present invention. The blocks of the flow chart may represent steps of the method 100, but in some alternative implementations, the functions noted in the various blocks may occur out of the order depicted in FIG. 1. For example, two blocks shown in succession in FIG. 1 may in fact be executed substantially concurrently, or the blocks may sometimes be executed in the reverse order depending upon the functionality involved.

Figure 2:
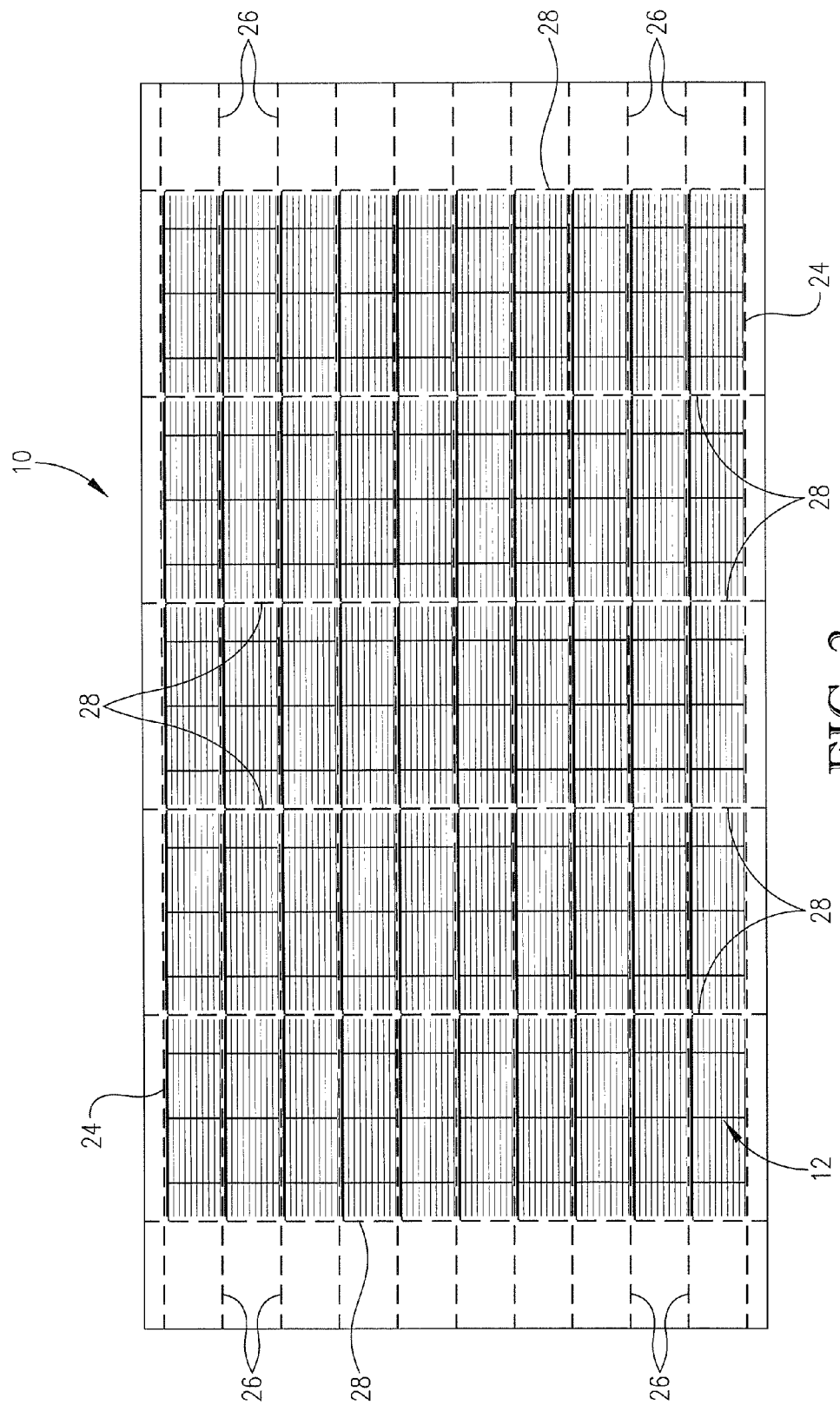
FIG. 2 is a plan view of a PV coated substrate with conductors and insulators printed thereon and shown with cut lines for forming the individual PV cells.

A PV coated substrate is first created or obtained as depicted by step 102. The PV coated substrate includes an underlying substrate on which is deposited layers of PV material. An exemplary PV coated substrate 10 is shown in FIG. 2 along with conductors and insulators that are applied in subsequent steps of the method 100 and cut lines for separating the PV coated substrate, conductors and insulators into individual PV cells.

The underlying substrate itself may be a sheet of conductive metal such as stainless steel or aluminum foil. The substrate may also be formed of glass, plastic, or polyimide film that is coated on its bottom surface with a conductive material such as Molybdenum.

The top surface of the substrate is coated with layers of PV material such as amorphous silicon (a-Si) or other thin-film silicon (TF-Si); cadmium telluride (Cd—Te); copper indium gallium selenide (CIS or CIGS) or other PV thin film materials used for this purpose; and/or molybdenum. The PV material may be applied to the substrate by chemical vapor deposition, sputtering, hot-wire deposition techniques, printing, or other deposition techniques. The substrate may also be coated with a buffer layer of CdS or similar material and a layer of transparent conductive oxide (TCO). The PV material and other layers may be applied to the substrate as a part of the method 100, or the PV coated substrate may be produced and obtained from others for use in the method 100.

The PV coated substrate 10 may be formed or otherwise provided in sheets or rolls so as to facilitate subsequent screen printing, cutting, or other steps described below. In one embodiment, the PV coated substrate is approximately 330 mm wide, 330 mm long, and 50 µm thick, but its particular shape and size is not important to the present invention.

A conductor or conductors generally referred to by the numeral 12 in FIGS. 1 and 2 are then deposited or otherwise applied to the top surface of the PV coated substrate 10 as depicted by step 104. In use, the conductors 12 collect the electricity generated by the PV material. In one embodiment, the conductors 12 are patterned with conductive ink such as silver ink that is screen printed or otherwise deposited on the top surface of the PV coated substrate 10. The conductors 12 may be applied to the PV coated substrate in a pattern such as grid of intersecting conductors 14 and bus bars 16 as shown in FIG. 4, but the particular pattern is not important to the present invention.

Figure 3:
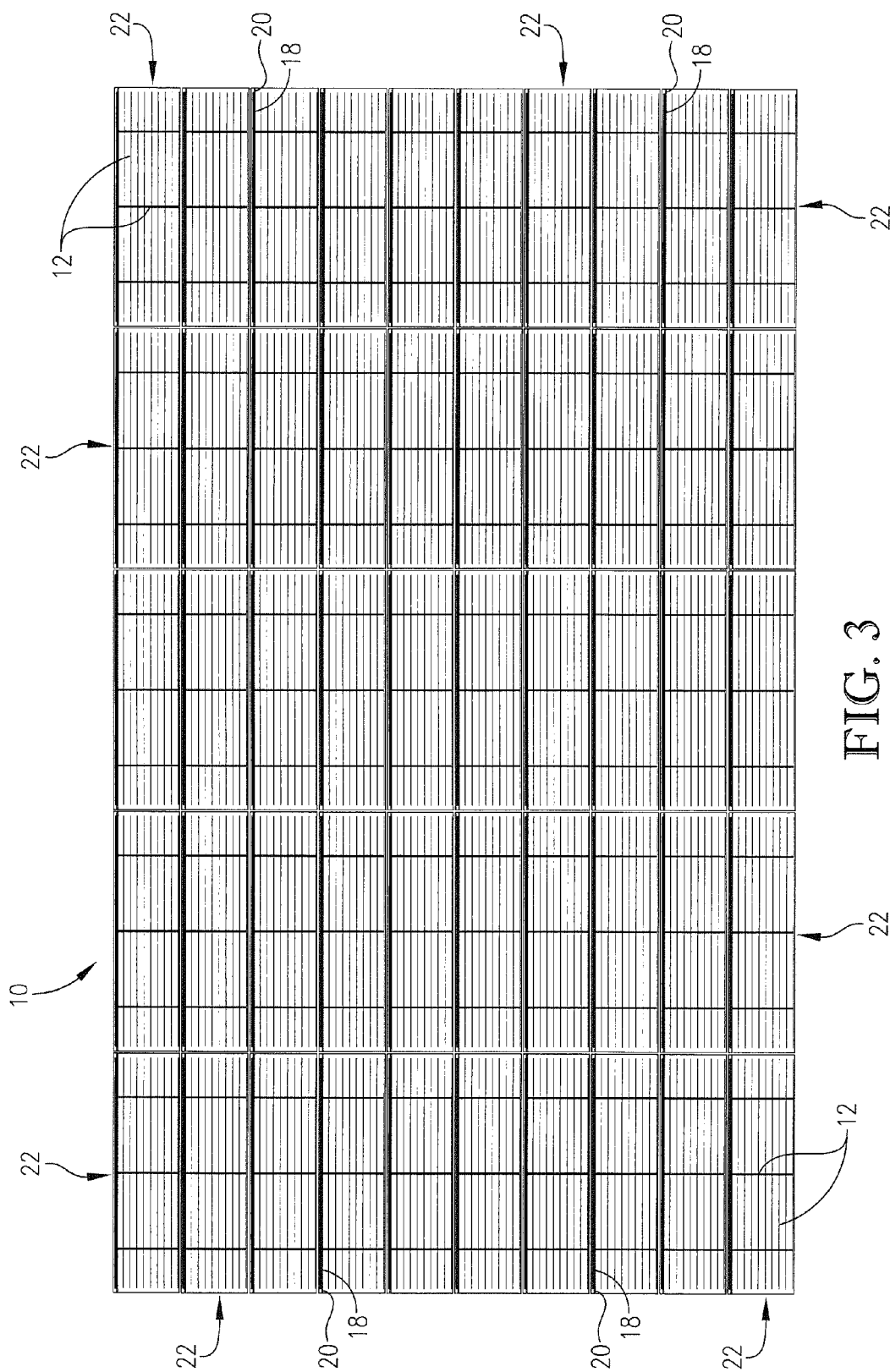
FIG. 3 is plan view of the PV coated substrate of FIG. 3 after it has been cut along the cut lines.

In one embodiment, a series of parallel "joiner" conductors 18 are printed or otherwise deposited lengthwise on the PV coated substrate as best illustrated in FIG. 3. The joiner conductors 18 facilitate the connection of individual PV cells to form a PV module as described below.

A plurality of insulator strips 20 are also printed or otherwise deposited on the PV-coated substrate adjacent the joiner conductors 18 as depicted by step 106. The insulator strips 20 may be formed with dielectric ink material that is screen printed or otherwise deposited on the PV coated substrate after the application of the conductors 12. The insulator strips 20 may partially overlap the joiner conductors 18 and are provided to prevent unintentional electrical contact of two adjacent PV cells as described in more detail below.

The PV coated substrate 10 with the conductors and insulators deposited thereon is then formed into a plurality of individual PV cells 22 as depicted by step 108. The PV material deposited on the substrate may be thinner near the edges of the substrate making these edges less useful for the desired PV effect. Thus, before separating the PV coated substrate into individual PV cells, the edges of the PV substrate may be trimmed, known as "edge deletion" in the art, along the dashed lines 24 shown in FIG. 2 to remove these edges as depicted by step 110.

The trimmed PV coated substrate is then cut along the dashed lines 26 and 28 to form the individual rectangular-shaped PV cells 22 as depicted by step 112. In one embodiment, each PV cell is approximately 100 mm by 200 mm, but the exact size and shape of the PV cells is not important. FIG. 3 shows the PV coated substrate being cut into fifty individual PV cells 22, but any number of PV cells 22 may be produced with the method 100.

As best illustrated in FIG. 4, the PV coated substrate 10 is cut so that each of the PV cells 22 has some of the conductors 12, a joiner conductor 18, and an insulator strip 20 on its top surface, with the joiner conductor 18 and insulator strip 20 being positioned along an edge of each PV cell.

As mentioned above, the PV material is not always deposited on the substrate evenly, so the voltage of the individual PV cells 22 may not be the same. In some applications, it is desirable for all of the PV cells in a PV module to have the same voltage rating. Thus, the PV cells 22 may be measured, sorted, and separated based on voltage as depicted by step 114 so that cells of similar voltage may be matched together to produce a matched-strength PV module. For example, some of the PV cells 22 may generate 1.75 volts, others may generate approximately 2 volts, and still others may generate approximately 2.25 volts. The individual cells may be sorted and separated by these three voltage ratings so that similarly rated PV cells are joined together.

Figure 5:
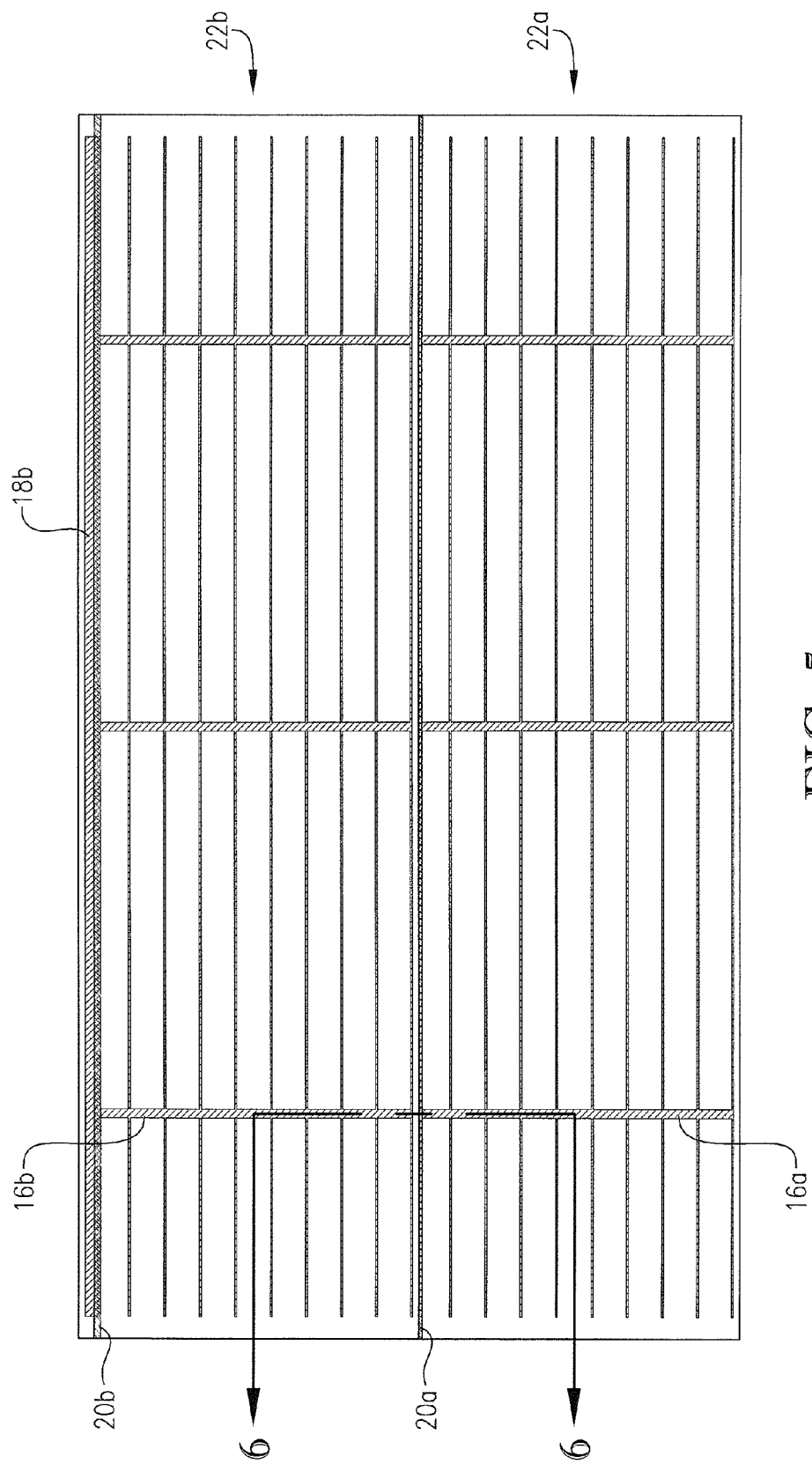
FIG. 5 is a plan view of two PV cells that have been joined together.

The sorted and matched PV cells are then joined together to form a PV module as depicted in step 116. FIGS. 5 and 6 depict the joining of a first PV cell 22a with a second PV cell 22b. Note that FIG. 6 does not show the PV coated substrates as having separate underlying substrates and PV materials applied thereon. Rather, FIG. 6 shows the PV coated substrates 10a and 10b as having a single layer in order to more clearly illustrate the other materials deposited thereon.

The PV cells 22a, 22b are joined by placing an edge of the first PV cell 22a under an edge of the second PV cell so that the joiner conductor 18a on the first PV cell contacts the conductive bottom surface of the second PV cell. As best shown in FIG. 6, the PV cells are preferably positioned so that the insulator strip 20a on the first PV cell is partially, but not completely, covered by the edge of the second PV cell. This prevents unintentional contact between the edge of the second PV cell and the top surface of the adjoining first PV cell. Multiple PV cells may be joined in this manner to form a PV module having any desired number of individual cells.

The module is then subjected to a bonding or curing step to securely join the PV cells as depicted in step 118. In one embodiment, the conductive ink that forms the conductors 12 and joiner conductors 18 and the insulator ink that forms the insulator strips 20 are formed of "intermediate-stage" inks that may be printed or otherwise applied to the PV coated substrate in a partially cured state. When the individual PV cells 22 are overlapped and joined as described above, the contact locations of the cells may be subjected to sufficient pressure and heat to fully cure the conductive ink and insulator ink. The entire PV module may later be subjected to a final heating and/or pressure stage to permanently bond the PV cells together.

Some of the above-described steps of the method 100 may be performed in any suitable machines such as screen printing machines, die cutting machines, etc. For example, the conductors 12, 14, 16, and 18 and the insulators 20 may be applied to the PV substrate 10 by a screen printing machine or similar machine, and the PV substrate 10 may be cut into the individual PV cells 22 by a die cutting machine or slitting or laser cutting or similar machine.

Although the invention has been described with reference to the preferred embodiment illustrated in the attached drawing figures, it is noted that equivalents may be employed and substitutions made herein without departing from the scope of the invention as recited in the claims.

Having thus described the preferred embodiment of the invention, what is claimed as new and desired to be protected by Letters Patent includes the following:

1. A method of forming a PV module comprising:
   obtaining a PV coated substrate;
   forming conductors on a top surface of the PV coated substrate;
   forming insulators on the top surface of the PV coated substrate;
   cutting the PV coated substrate to form a plurality of individual PV cells, wherein each of the PV cells has some of the conductors and an insulator on its top surface; and
   attaching an edge of a first one of the PV cells under an edge of a second one of the PV cells so that at least a portion of the conductors on the first PV cell electrically contacts a bottom surface of the second PV cell and so that the insulator on the first PV cell is partially, but not completely, covered by the edge of the second PV cell.

2. The method of claim 1, wherein the forming conductors step comprises applying a pattern of conductive ink to the top surface of the PV coated substrate to form the conductors.

3. The method of claim 1, wherein the forming insulators step comprises applying an insulative ink to the top surface of the PV coated substrate to form the insulators.

4. The method of claim 1, further comprising the step of bonding the first and second PV cells together by applying pressure and heat to the edges of the PV cells.

5. The method of claim 2, wherein the conductive ink is silver ink.

6. The method of claim 1, further comprising the step of trimming edges from the PV coated substrate before cutting the PV coated substrate to form the individual PV cells.

7. The method of claim 1, wherein the forming conductor and the forming insulators steps are performed by a screen printing machine.

8. The method of claim 1, wherein the cutting step is performed by a die-cutting or slitting or laser cutting machine.

9. A method of forming a PV module comprising:
   obtaining a PV coated substrate;
   forming conductors on a top surface of the PV coated substrate;
   cutting the PV coated substrate to form a plurality of individual PV cells, wherein each of the PV cells has some of the conductors on its top surface;
   sorting the PV cells by voltage rating, such that only PV cells with similarly rated voltages may be joined together; and
   attaching an edge of a first one of the PV cells under an edge of a second one of the PV cells so that at least a portion of the conductors on the first PV cell electrically contacts a bottom surface of the second PV cell.

10. The method of claim 9, wherein the forming conductors step comprises applying a pattern of conductive ink to the top surface of the PV coated substrate to form the conductors.

11. The method of claim 9, further comprising the step of bonding the first and second PV cells together by applying pressure and heat to the edges of the PV cells.

12. The method of claim 9, further comprising the step of forming a series of insulators on the top surface of the PV coated substrate.

13. The method of claim 9, further comprising the step of trimming edges from the PV coated substrate before cutting the PV coated substrate to form the individual PV cells.

14. A method of forming a PV module comprising:
   obtaining a PV coated substrate;
   forming conductors on a top surface of the PV coated substrate;
   forming insulators on the top surface of the PV coated substrate;
   trimming edges from the PV coated substrate;
   cutting the PV coated substrate to form a plurality of individual PV cells, wherein each of the PV cells has some of the conductors and an insulator on its top surface;
   attaching an edge of a first one of the PV cells under an edge of a second one of the PV cells so that at least a portion of the conductors on the first PV cell electrically contacts a bottom surface of the second PV cell and so that the insulator on the first PV cell is partially, but not completely, covered by the edge of the second PV cell; and
   bonding the first and second PV cells together by applying pressure and heat to the edges of the PV cells.

15. The method of claim 14, wherein the forming conductors step comprises applying a pattern of conductive ink to the top surface of the PV coated substrate.

16. The method of claim 14 wherein the forming insulators step comprises applying an insulative ink to the top surface of the PV coated substrate.

17. The method of claim 15, wherein the conductive ink is silver ink.

* * * * *